(12) United States Patent
Kanamori

(10) Patent No.: US 6,353,402 B1
(45) Date of Patent: Mar. 5, 2002

(54) CURRENT ADDITION TYPE D/A CONVERTER WITH LOW POWER CONSUMPTION MODE

(75) Inventor: Koji Kanamori, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/697,147

(22) Filed: Oct. 27, 2000

(30) Foreign Application Priority Data

Nov. 8, 1999 (JP) ............................................. 11-316809

(51) Int. Cl.[7] .......................... H03M 1/06; H03M 1/66; G05F 3/16; G05F 3/20
(52) U.S. Cl. ........................ 341/118; 341/144; 323/315
(58) Field of Search ................................. 341/144, 135, 341/136, 118, 120, 133, 145, 152; 323/315; 370/311

(56) References Cited

U.S. PATENT DOCUMENTS

| | | | |
|---|---|---|---|
| 5,017,919 A | * 5/1991 | Hull et al. | ................. 341/136 |
| 5,272,432 A | * 12/1993 | Nguyen et al. | .............. 323/315 |
| 5,307,065 A | 4/1994 | Tokuhiro | |
| 5,635,935 A | 6/1997 | Ignowski et al. | |
| 5,654,710 A | 8/1997 | Oh et al. | |
| 5,666,355 A | * 9/1997 | Huah et al. | .................. 370/311 |
| 5,798,723 A | * 8/1998 | Fong | ........................... 341/136 |
| 5,835,039 A | * 11/1998 | Giacomini | ........... 160/178.1 R |
| 5,861,830 A | * 1/1999 | Cheng et al. | ................ 341/135 |
| 6,166,670 A | * 12/2000 | O'Shaughnessy | ........... 341/136 |

* cited by examiner

*Primary Examiner*—Patrick Wamsley
(74) *Attorney, Agent, or Firm*—Greenblum & Bernstein, P.L.C.

(57) ABSTRACT

The current addition type D/A converter of the present invention is equipped with a control circuit to reduce power consumption. A control signal is input from a control terminal (17), the resistance value of a resistor (10) that determines a reference current of a current mirror is multiplied n-fold and thereby the operating current of current cell matrix (1) is reduced to (1/n). On the other hand, the resistance value of a current/voltage conversion resistor (16) is multiplied n-fold so as to compensate the reduction of the operating current and maintain a predetermined D/A conversion rate. Normally, there is no input near an upper limit of the input dynamic range, and therefore there is no inconvenience regarding the conversion rate of the D/A converter even if the operating current is reduced.

8 Claims, 11 Drawing Sheets

CURRENT ADDITION TYPE D/A CONVERTER WITH LOW POWER CONSUMPTION MODE

BACKGROUND OF THE INVENTION

1. Field of the Invention

The present invention relates to a current addition type D/A converter.

2. Description of the Related Art

A cellular phone set based on a CDMA communication system sends an analog signal converted by a D/A converter from a digital signal subjected to spreading/modulation.

The performance required of a D/A converter is determined by, for example, IMT2000, a worldwide unified standard for mobile communications. For example, the standard specifies the number of gradations of a D/A converter and the range of a maximum allowable conversion rate when digital data is converted to an analog signal, etc.

When extremely fast D/A conversion is required, a current addition type (flash type) D/A converter is used. A current addition type D/A converter is a type of converter that generates a current corresponding to an input digital signal, flows the current into a current/voltage conversion resistor and thereby obtains voltage output corresponding to the input value.

Suppose a digital signal input to the current addition type D/A converter takes 256 values. Also suppose 256 reference current sources are provided in response to the input value. Then, according to "1" and "0" of the input bits, switching ON/OFF of the reference current sources corresponding to the input bits is controlled. A/D conversion is implemented by adding up currents output from ON-state reference current sources and converting the total current to a voltage.

In a current addition type D/A converter, a predetermined amount of current flows constantly through multiple reference current sources. This involves a problem that it is difficult to reduce power consumption.

However, it is not possible to reduce currents themselves generated by the reference current sources, either. This is because reducing the amount of current of each reference current source itself reduces the D/A conversion rate, failing to satisfy the predetermined standard.

On the other hand, for a mobile communication apparatus such as a cellular phone, reduction of power consumption of the apparatus is a stringent requirement. This involves a problem that if power consumed by the D/A converter increases too much, its power consumption does not meet the power consumption standard for the cellular phone. Another problem with the conventional addition type D/A converter is that it forces peripheral circuits to reduce power consumption excessively.

The present invention has been implemented to solve such problems and it is an object of the present invention to effectively suppress the amount of power consumption of a D/A converter.

SUMMARY OF THE INVENTION

The D/A converter of the present invention has a circuit configuration to reduce power consumption.

The performance of a D/A converter specified by a standard is naturally based on the premise that conversion output will be obtained within a predetermined time regardless of the type of input. That is, the standard specifies the highest performance.

As the value of a digital signal input increases, the voltage after D/A conversion increases proportionally. Generating a high voltage within a predetermined time using a current/voltage conversion resistor requires a great amount of current. The standard specification determines an amount of reference current so that a conversion voltage can be generated within a predetermined time even in the case of data input at an upper limit of the dynamic range of the D/A converter.

However, it is extremely rare that data near an upper limit of the dynamic range of the D/A converter is actually input except the case where a communication apparatus is used for a special purpose. Therefore, if there is obviously no high level input, reducing the amount of reference current produces no problem. That is, with low level input, it is possible to generate a conversion voltage within a predetermined time even if the amount of reference current is reduced.

Thus, for example, a circuit condition in a low consumption mode is set and the amount of reference current reduced at factory settings. It is possible to reduce the amount of reference current by appropriately combining a change of the size of MOS transistors, replacement of fixed resistors with variable resistors or modification of input data.

An embodiment of the present invention, for example, cuts a current that flows through a current mirror by half to reduce the operating current of the D/A converter to a half. On the other hand, it doubles the resistance of the current/voltage conversion resistor (variable resistor) to generate a predetermined conversion voltage. Instead of doubling the resistance value, it is also possible to apply shift processing to an input digital value to compensate the amount of current reduced.

Another embodiment of the present invention reduces the amount of operating current by turning OFF unnecessary current cells.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS

Figure 10A:
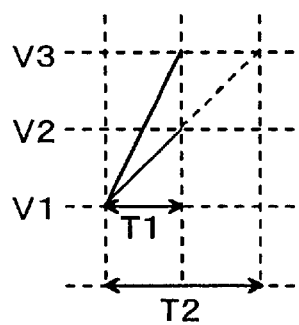
FIG. 10A illustrates a time variation of an input voltage of a D/A converter.
Figure 10B:
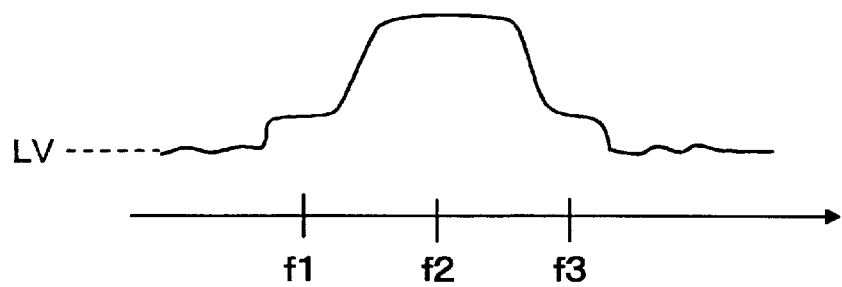
FIG. 10B is a waveform diagram showing an example of transmit power (adjacent channel leakage power) versus the frequency of a transmission signal in a transmitter of a cellular phone.
Figure 10C:
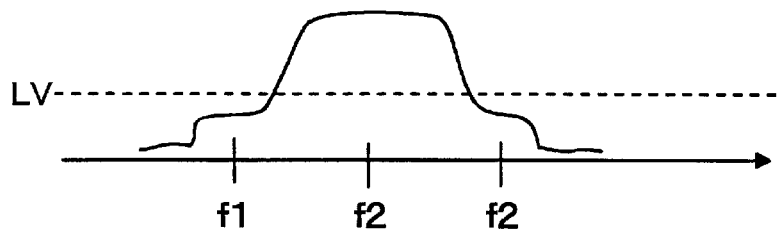
FIG. 10C is a waveform diagram showing another example of transmit power (adjacent channel leakage power) versus the frequency of a transmission signal in a transmitter of a cellular phone.

With reference now to FIGS. 10A, 10B and 10C, the reason that the present invention can reduce power consumption of a D/A converter will be explained in detail below.

FIG. 10A shows a voltage transition with respect to an elapsed time (horizontal axis) when the voltage between both ends of a current/voltage conversion resistor rises from V1 to V3 through V2. In the figure, suppose period T1 is an allowable conversion time.

Attempting to generate a high-level voltage V3 will require the voltage to be increased drastically. However, if only a low-level voltage V2 needs to be generated, it is understandable that a voltage rise can take place slowly.

FIGS. 10B and 10C show transmit power (vertical axis) with respect to the frequency (horizontal axis) of a D/A converter used for transmission of a cellular phone when the operating current of the D/A converter is reduced. That is, FIGS. 10B and 10C show adjacent channel leakage power in the transmitter.

Here, FIG. 10B shows adjacent channel leakage power when the voltage of a signal to be transmitted is high (that is, the output level of the D/A converter is high). FIG. 10C shows adjacent channel leakage power when the voltage of a signal to be transmitted is low (that is, the output level of the D/A converter is low). In the figure, "LV" indicates a noise floor (the level of normal noise).

When the level of a signal to be transmitted is high (FIG. 10B), leakage power due to harmonic distortion that occurs in the D/A converter is detected in channels (frequency f2) adjacent to the transmission channel (frequency f1) and this increases noise. Therefore, reducing the amount of current under a circumstance under which a signal near an upper limit of the dynamic range is input to the D/A converter will increase noise, which is not desirable.

However, in the case where the voltage of a signal to be transmitted is small (FIG. 10C), though a similar curve of adjacent leakage power exists, the curve sinks by the amount of a drop in the voltage level. After all, the level of noise caused by adjacent leakage power falls below the level of the noise floor (LV) and buried in the noise floor (normal noise level). In a normal communication, almost no high level is input near an upper limit of the dynamic range. That is, the output level of the D/A converter is not so big.

Therefore, under a normal communication condition, reducing the operating current to reduce power consumption causes no problem with noise deriving from adjacent leakage power.

As is clear from the above explanation, in the case where the voltage of an input digital signal does not reach a high value in a transmitter, decreasing the current of the D/A converter as shown in FIG. 10C causes no actual problems.

For example, if a conversion rate of 1 to 200 gradations is guaranteed with a 256-gradation D/A converter, there is no problem even if conversion in the high-level gradation area becomes a little slower.

Focused on such a point, the present invention makes it possible to select a mode to reduce current consumption appropriately using a control signal from the outside.

Embodiment 1

Figure 1:
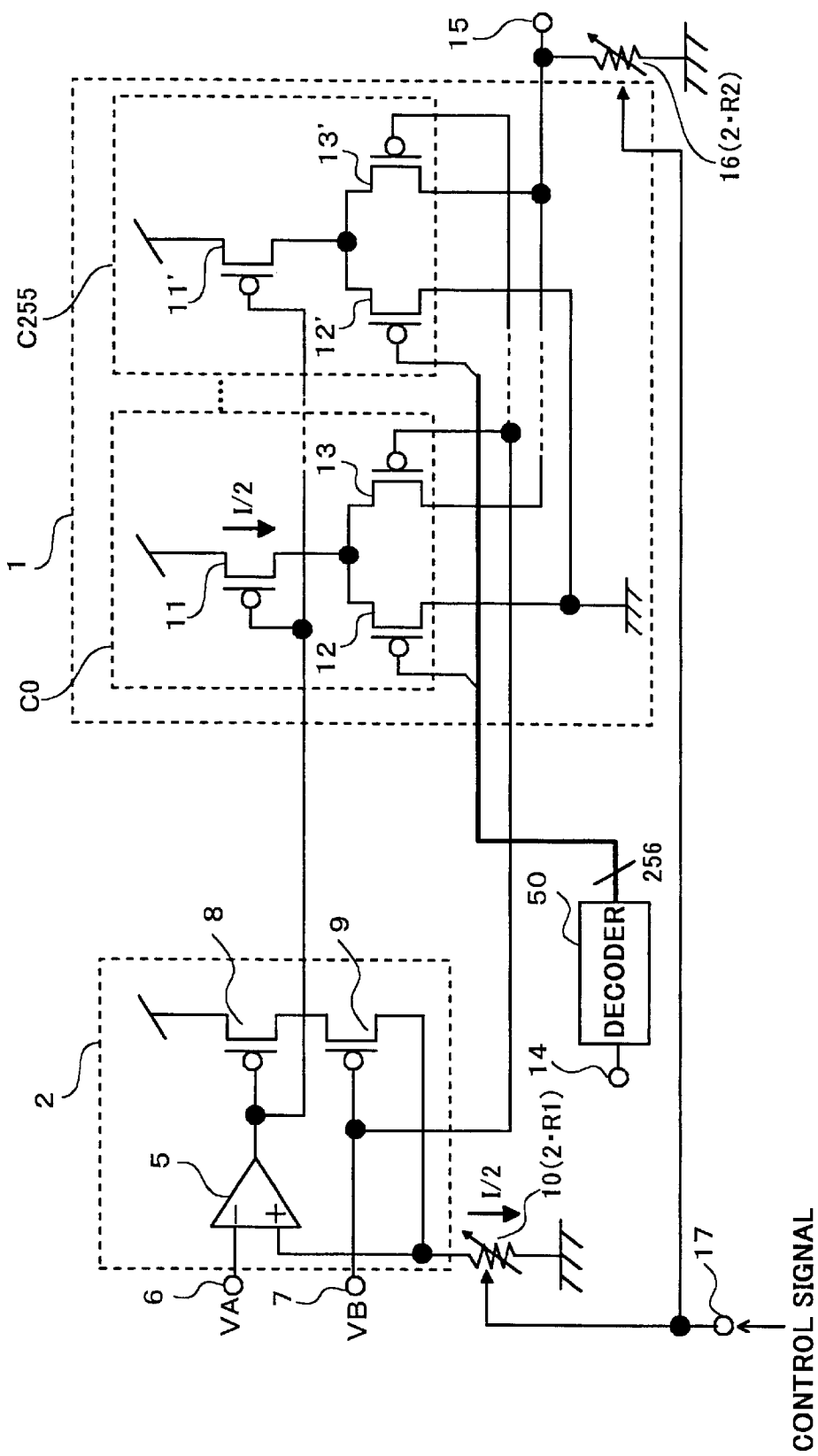
FIG. 1 is a circuit diagram showing a configuration of a current addition type D/A converter according to Embodiment 1 of the present invention.

FIG. 1 is a circuit diagram showing a configuration of a current addition type D/A converter according to Embodiment 1 of the present invention.

Figure 11:
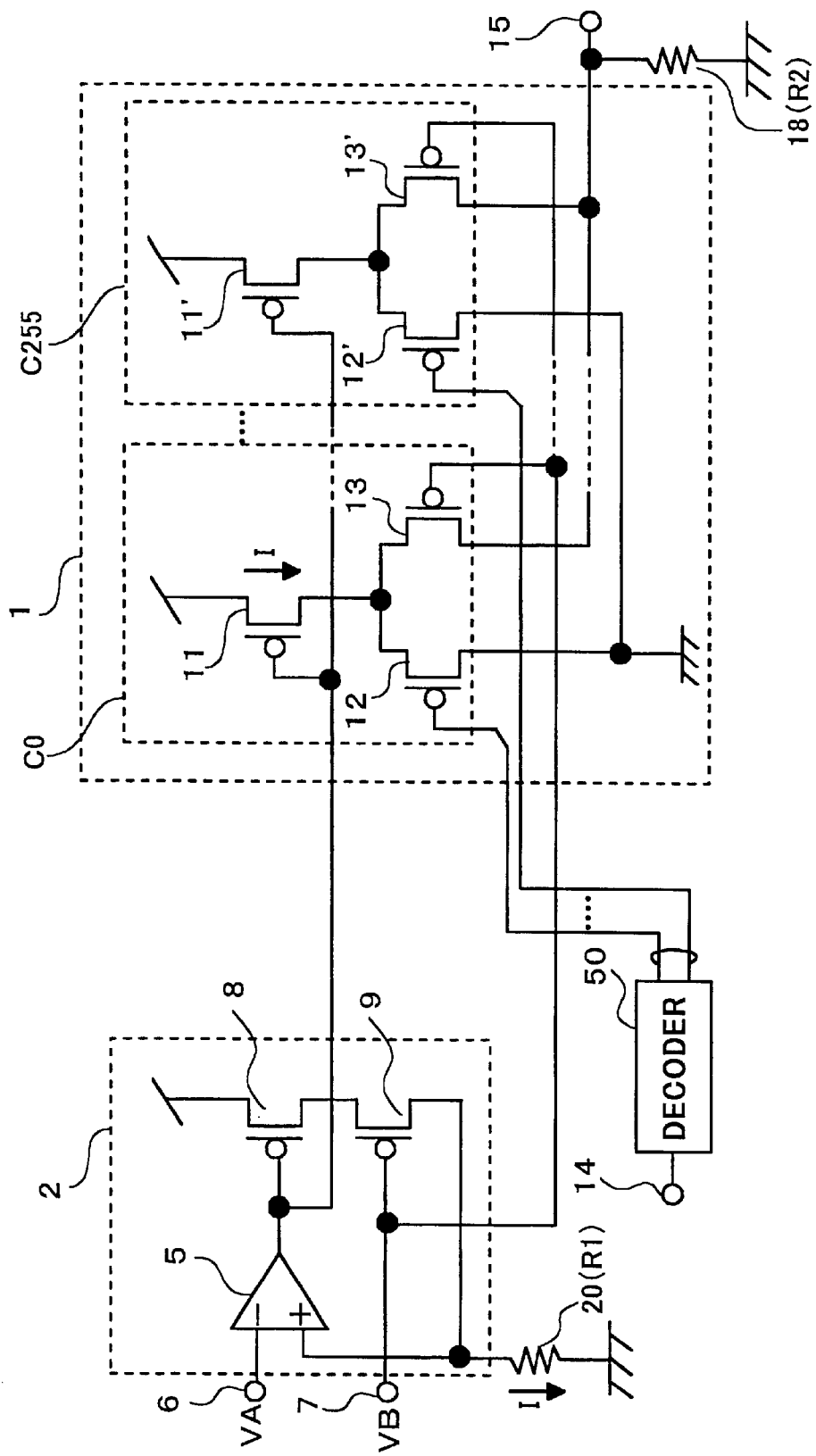
FIG. 11 illustrates a circuit showing a configuration example of a current addition type D/A converter without using the present invention.

On the other hand, FIG. 11 is a circuit diagram showing a basic configuration of a current addition type D/A converter without using the present invention. First, a basic configuration of a current addition type D/A converter will be explained using FIG. 11.

As shown in FIG. 11, this D/A converter comprises a current cell matrix 1 (equipped with a plurality of current cells C0 to C255), bias circuit 2, decoder 50 that decodes a digital signal input from input terminal 14, resistor 20 (resistance value "R1") and resistor 18 (resistance value "R2").

Resistor 18 (resistance value "R2") shown at the bottom right of the figure is a current/voltage conversion resistor. Currents output from current cells C0 to C255 that form current matrix 1 flow into this current/voltage conversion resistor 18 and the voltage output to output terminal 15 is determined by a product of the sum total of these currents by the resistance value of resistor 18 (that is, "R2").

Each of current cells C0 to C255 that form current cell matrix 1 has, as shown in the figure, PMOS transistor (current source transistor) 11 that supplies a current and switching PMOS transistors (12, 13 . . . 12', 13') that form a differential pair to select whether the current should be input to current/voltage conversion resistor 18 or thrown out to ground.

Voltage VB at voltage terminal 7 is commonly applied to the gates of switching PMOS transistors (13 . . . 13') in current cells C0 to C255.

On the other hand, the output voltage of decoder 50 (decoded output voltage) is applied to the gates of switching PMOS transistors (12 . . . 12') in current cells C0 to C255.

If the gate voltage of switching transistor 12 is greater than reference voltage VB, transistor 12 (12') turns OFF and transistor 13 (13') turns ON, and the current (I) of its current cell flows into current/voltage conversion resistor 18. On the other hand, if the gate voltage of switching transistor 12 (12') is smaller than reference voltage VB, transistor 12 (12') turns ON and transistor 13 (13') turns OFF and the current (I) of its current cell flows to ground.

In FIG. 11, bias circuit 2 is a circuit that makes it possible to supply current I in current cells C0 to C255 that form current cell matrix 1.

As shown in the figure, bias circuit 2 comprises operational amplifier 5 that receives reference voltage VA and reference voltage VB as inputs, PMOS transistors 8 and 9, and reference resistor 20 (resistance value "R1")

PMOS transistor 8 and current source transistors (11 . . . 11') in current cells C0 to C255 form a current mirror.

Since the voltage of the non-inversion input terminal of operational amplifier 5 is equal to reference voltage VA, reference current I on the input side of the current mirror is obtained by dividing reference voltage VA by the resistance value (R1) of reference resistor 20. That is, I=VA/R1.

Since this reference current I flows through PMOS transistors 8 and 9, the reference current on the input side of the current mirror is I (=VA/R1). If the current mirror ratio of the current mirror is designed to be 1:1, that is, if the channel conductance (W/L) of transistor 8 and that of transistor 11 are designed to be identical, output current I is obtained from current source transistor 11 of each of current cells C0 to C255.

Output current I of each current cell is added up according to the output of decoder 50, converted to a voltage by current/voltage conversion resistor 18 and the output of the current addition type D/A converter is obtained from output terminal 15.

This completes the explanation of the basic circuit configuration of the current addition type D/A converter.

Next, the D/A converter according to Embodiment 1 of the present invention shown in FIG. 1 will be explained.

The D/A converter of this embodiment is characterized by the ability to change the mode of the current addition type D/A converter to a low power consumption mode by adding control terminal 17 and inputting a control signal from control terminal 17.

That is, providing a resistance value of reference resistor (variable resistor) 10 twice that of the prior art in FIG. 11 (that is, 2·R1) reduces the reference current of the current mirror to ½ and reduces the operating current in current cells C0 to C255 to ½. On the other hand, to compensate the 50% reduction in the current, the resistance value of current/voltage conversion resistor 16 is doubled (that is, 2·R2) and the amount of a voltage drop is kept the same as the prior art. In this way, a conversion voltage equivalent to that of the prior art is output.

The basic configuration of the D/A converter in FIG. 1 is the same as the conventional example in FIG. 11. The same components of the D/A converter in FIG. 1 as those in FIG. 11 are assigned the same reference numerals.

In FIG. 1, current cell matrix 1 has a plurality of current cells (C0 to C255).

A bias voltage is applied from bias circuit 2 to the gates of current source transistors (11 . . . 11') of current cells (C0 to C55).

Bias circuit 2 comprises operational amplifier 5, PMOS transistor 8 on the reference side of the current mirror and switching transistor (PMOS transistor) 9. This switching transistor 9 is provided so that the circuit on the reference side of the current mirror has a configuration equivalent to the circuit configuration of current cells C0 to C255. Transistor 8 and transistors (11 . . . 11') that form the current mirror have the same structure and size. That is, each transistor has the same channel conductance W/L, and therefore the current mirror ratio is 1:1.

A reference voltage (VA) is applied to the inversion terminal of operational amplifier 5 from terminal 6. A switching control voltage (VB) is applied to the gate of switching transistor 9 from terminal 7.

Furthermore, reference resistor 10 is a resistor whose resistance value can be changed (variable resistor). The resistance value of reference resistor 10 varies depending on a control voltage applied from the outside via control terminal 17. Control terminal 17 is a terminal to input a control signal to switch the mode of the D/A converter to a low power consumption mode.

n-bit input data is input from terminal 14. The n-bit input data is decoded by decoder 50. ON/OFF of the differential switching transistors (12 . . . 12') in current cells C0 to C255 is controlled according to H/L of the output voltage of decoder 50.

Current/voltage conversion resistor 16 converts currents input from On-state current cells (C0 to C255) to a voltage. The resistance value of current/voltage conversion resistor 16 varies depending on the control signal input from control terminal 17.

The operation of the current addition type D/A converter of this embodiment with such a configuration will be explained below.

In bias circuit 2, an imaginary short is established at operational amplifier 5 and the potential at the non-inversion input terminal of operational amplifier 5 becomes equal to reference voltage VA applied to reference voltage input terminal 6. Therefore, the reference current is determined by reference voltage VA and the resistance value of reference resistor 10.

This current becomes the current that flows through transistor 8 on the reference side of the current mirror. Then, this current is mirrored and becomes an operating current in current cells C0 to C255.

In current cells C0 to C255, when the gate voltage of PMOS transistor 12 falls below the gate voltage (=VB) of PMOS transistor 13 as a result of decoding by decoder 50, PMOS transistor 12 turns ON and the current of the current cell flows into current/voltage conversion resistor 16. This results in a conversion output.

On the other hand, in a current cell in which the gate voltage of PMOS transistor 12 is higher than VB, PMOS transistor 13 turns ON and the current of the current cell is thrown out to ground.

In this embodiment, at the factory setting, a control signal is input from control signal input terminal 17 and the resistance value of reference resistor 10 is set to 2·R1 and the amount of reference current is set to ½ of the example in FIG. 11 and thereby the operating current in current cells C0 to C255 is reduced by half.

On the other hand, to compensate this reduction in the amount of current and keep the conversion output the same as the previous level, the resistance value of current/voltage conversion resistor 16 is doubled (2·R2).

This makes it possible to reduce the current in bias circuit 2 by half and also reduce the operating current in current cell matrix 1 by half. This allows power consumption of the current addition type D/A converter to be reduced.

In this embodiment, the amount of current during low power consumption is reduced to ½, but the present invention is not limited to this. For example, it is also possible to reduce the amount of current to ¼ or ⅛. Furthermore, selection of a low power consumption mode can also be left to the discretion of the customer.

The extent to which the operating current can be reduced can be estimated to a certain degree by examining the past history of the output dynamic range of the signal to be sent.

That is, the dynamic range actually required for a D/A converter is estimated by examining the past operations of a communication apparatus. Then, a control signal at a desired level is given from control terminal 17 so that a predetermined conversion rate is guaranteed for the input signal within the dynamic range. This makes it possible to effectively reduce the operating current of the D/A converter while securing the function actually required of the D/A converter.

Adjustments for reducing power consumption of the D/A converter based on an analysis of past operation states can be automated by control using a computer. Such a control method can also be equally adopted in the D/A converters in the following embodiments.

Embodiment 2

Figure 2:
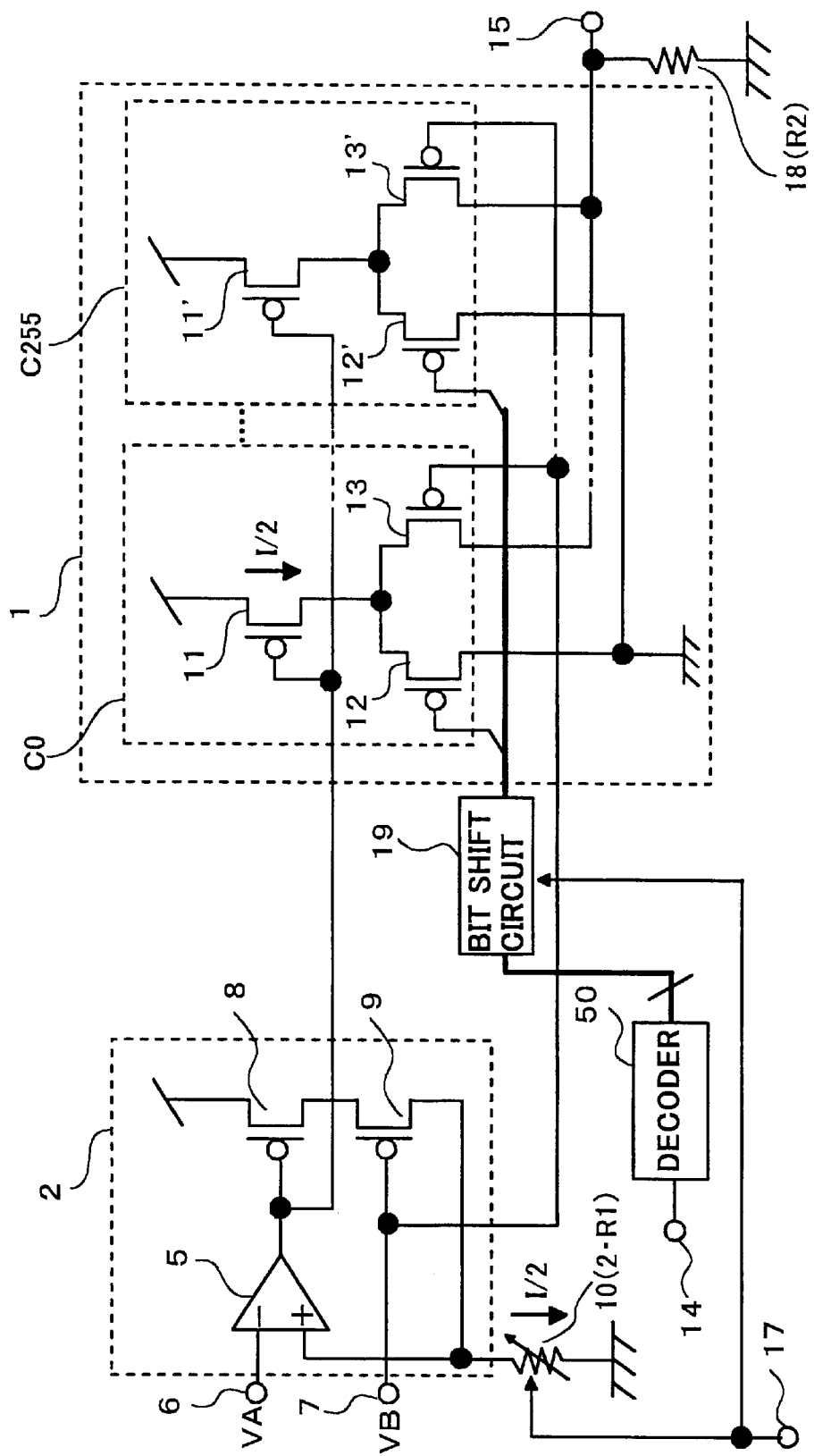
FIG. 2 is a circuit diagram showing a configuration of a current addition type D/A converter according to Embodiment 2 of the present invention.

FIG. 2 is a circuit diagram showing a configuration of a current addition type D/A converter according to Embodiment 2 of the present invention.

The basic configuration is the same as that of the circuit in FIG. 1. However, this embodiment is provided with bit shift circuit 19 that applies a bit shift to a signal output from decoder 50. Moreover, current/voltage conversion resistor 18 is fixed at resistance value R2 as in the case of the circuit in FIG. 11 and this is what differs from the circuit in FIG. 1.

Through a control signal input from control signal input terminal 17, the resistance value of reference resistor 10 is doubled, the reference current (current on the input side of the current mirror) is reduced to ½ and the operating current of current cells C0 to C255 is reduced by half. This makes it possible to reduce the operating currents of both the bias circuit and current cells by half as in the case of the aforementioned embodiment.

However, since the conversion output of the D/A converter is reduced to ½ in this way, a bit shift is applied to the output data of decoder 50 and the data value is doubled to prevent the conversion output of the D/A converter from being reduced to ½. This doubles the number of current cells that supply currents to current/voltage conversion resistor 18 and obtains the conversion output equivalent to that of the circuit in FIG. 1.

Embodiment 3

Figure 3:
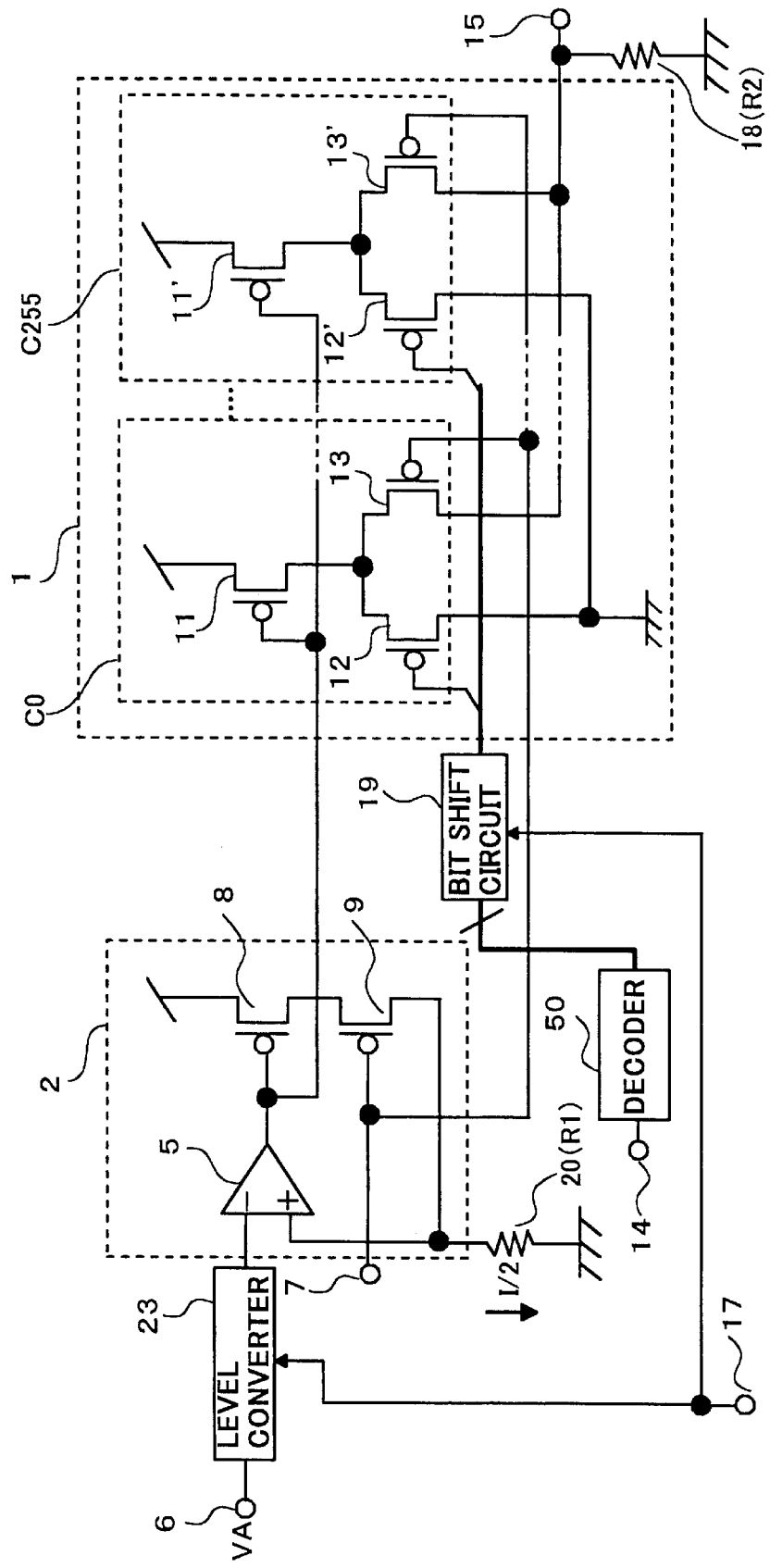
FIG. 3 is a circuit diagram showing a configuration of a current addition type D/A converter according to Embodiment 3 of the present invention.

FIG. 3 is a circuit diagram showing a configuration of a current addition type D/A converter according to Embodiment 3 of the present invention. The basic configuration is the same as that of the circuit in FIG. 2.

However, in the circuit of this embodiment, the resistance value of reference resistor 20 is fixed at R1. On the other hand, the level of a reference voltage (VA) applied to reference voltage input terminal 6 is shifted by a control signal input from control terminal 17 to reduce the level of an input voltage. When the level of the reference voltage is reduced to ½, the current that flows into transistor 8 in bias circuit 2 (reference current of the current mirror) becomes ½. The current in current matrix 1 is also reduced to ½ accordingly.

This makes it possible to reduce the operating currents in both bias circuit 2 and current matrix 1.

However, since the conversion output will fluctuate in this way, bit shift circuit 19 applies a bit shift to the output data of decoder 50 to prevent the conversion output voltage from fluctuating and compensate the reduction of the reference current.

That is, when the reference current of the current mirror is reduced to ½, bit shift circuit 19 shifts the data by 1 bit leftward and doubles the output of decoder 50. This keeps the voltage output from current/voltage conversion output 18 at the same level as that in the circuit in FIG. 1.

The above explanation describes the case where the reference voltage is reduced to ½ and digital data is doubled, but the present invention is not limited to this. It is also possible to reduce the reference voltage (VA) applied from reference voltage input terminal 6 to ¼ or ⅛ and quadruplicate or octuplicate digital data.

Embodiment 4

Figure 4:
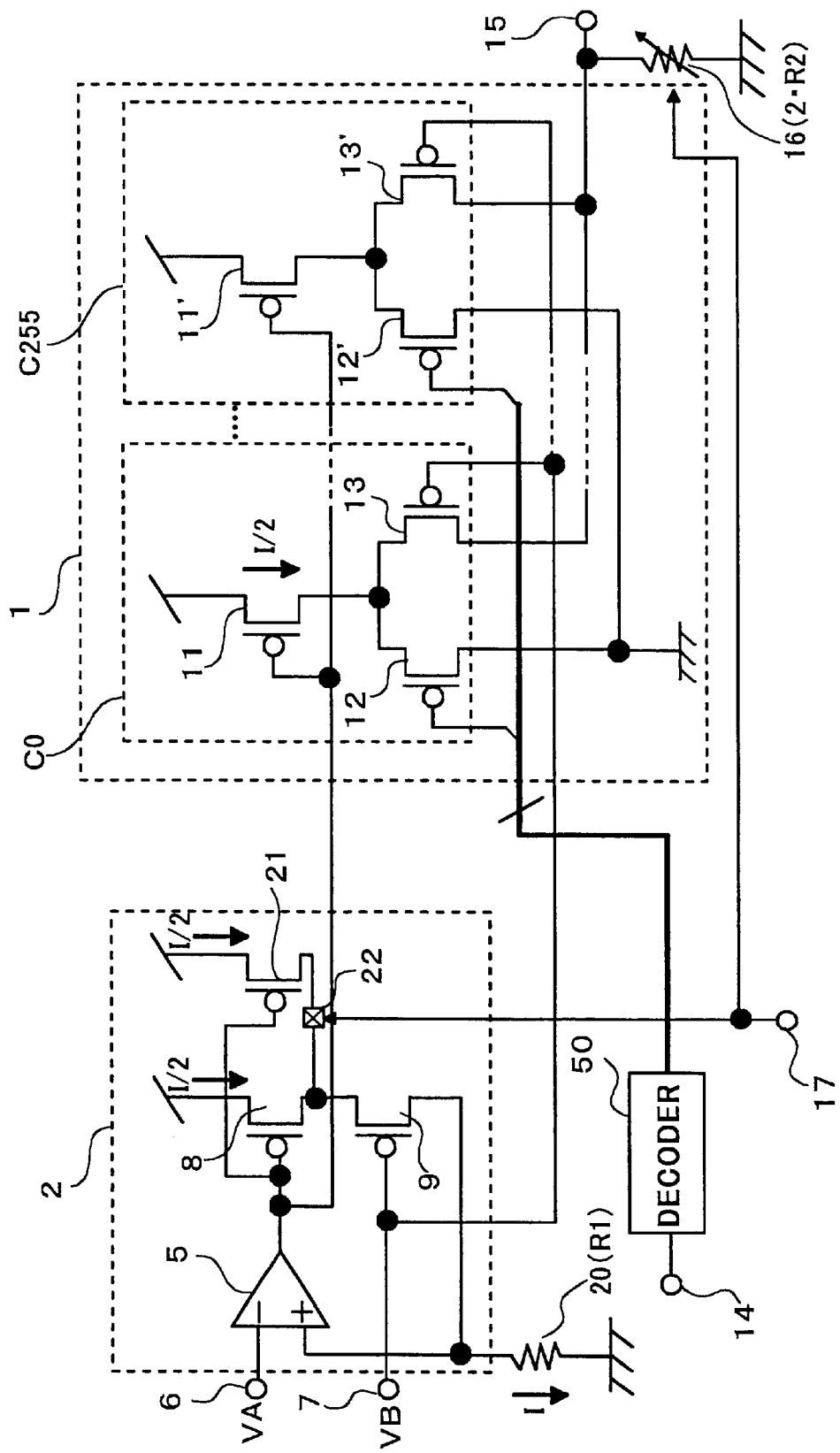
FIG. 4 is a circuit diagram showing a configuration of a current addition type D/A converter according to Embodiment 4 of the present invention.

FIG. 4 is a circuit diagram showing a configuration of a current addition type D/A converter according to Embodiment 4 of the present invention. The basic configuration is the same as that of the preceding embodiment.

This embodiment doubles the apparent size (that is, channel conductance W/L) of transistor 8 on the input side (reference side) forming the current mirror using a control signal given from the outside. This changes the current mirror ratio from 1:1 to 2:1.

A total operating current in bias circuit 2 (total amount of current on the reference side of the current mirror) is not changed.

This reduces the current flowing into current cells C0 to C255 to ½. This makes it possible to reduce power consumption. On the other hand, the resistance value of current/voltage conversion resistor (variable resistor) 16 is doubled (2·R2) to prevent the conversion output from fluctuating.

A more specific explanation will be given below. In FIG. 4, three transistors 8, 21 and 11 have the same size (W/L).

During a normal operation, switch 22 is OFF and transistor 21 is not used. The amount of reference current created by bias circuit 2 is "I".

Here, a control signal is input from terminal 17 to turn switch 22 ON. Then, the current is supplied from not only transistor 8 but also transistor 21. Since transistors 8 and 21 have the same size, the same amount of current flows through both transistors.

That is, the current that flows through transistor 8 is reduced to ½. This is equivalent to saying that the apparent (practical) size (W/L) of transistor 8 has doubled.

Since the current on the reference side of the current mirror has practically reduced to ½ (I/2), the output current of the current mirror (that is, current in each of current cells C0 to C255) also becomes I/2, thus attaining a reduction of power consumption.

The resistance value of current/voltage conversion resistor 16 is doubled (2·R2), which allows a desired conversion output voltage to be output.

Embodiment 5

Figure 5:
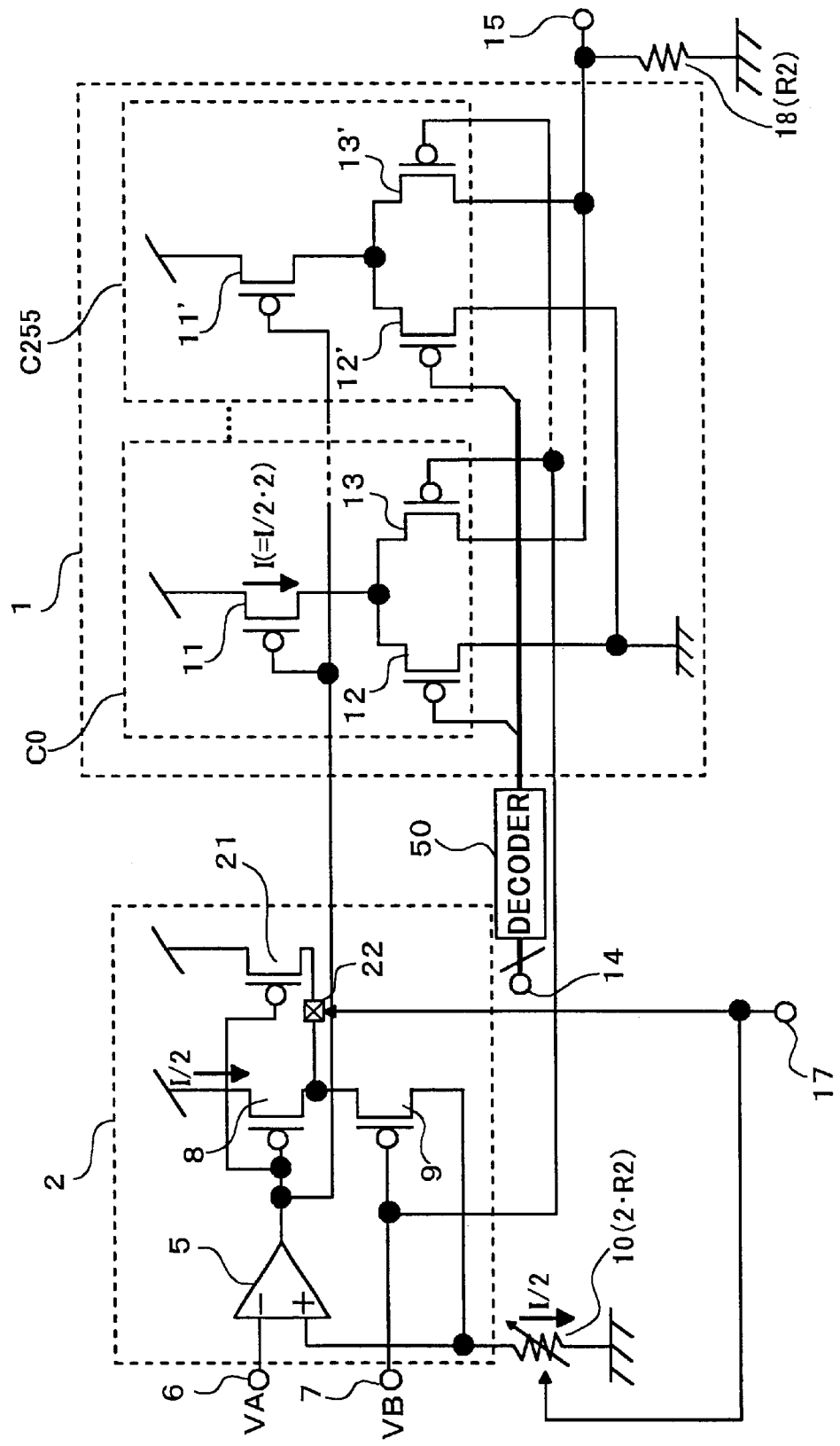
FIG. 5 is a circuit diagram showing a configuration of a current addition type D/A converter according to Embodiment 5 of the present invention.

FIG. 5 is a circuit diagram showing a configuration of a current addition type D/A converter according to Embodiment 5 of the present invention. The basic configuration is the same as that of the preceding embodiment. In this embodiment, only the operating current of bias circuit 2 is reduced.

That is, the size (W/L) of transistors 8 and 21 on the reference side of the current mirror is ½ of the size (W/L) of transistors (11 . . . 11') on the output side.

In a normal operation mode, switch 22 is ON, and two transistors 8 and 21 and transistors (11 . . . 11') form a current mirror of 1:1. In a normal operating mode, current I flows through reference resistor 10.

In a low power consumption mode, the resistance value of reference resistor (variable resistor) 10 is doubled (2·R1) by a control signal input from terminal 17 and the reference current is reduced to ½ (that is I/2).

At the same time, switch 22 is turned OFF. Concurrently with turning OFF of switch 22, transistor 21 is deactivated and the apparent size (W/L) of transistor 8 is reduced by half. The reference current (I/2) of the current mirror only flows through transistor 8.

Transistor 8 and transistor 11 form a current mirror of 1:2, and therefore current I (=(I/2)·2) flows through current cells C0 to C255 in the same way as a normal mode.

This makes it possible to reduce the operating current through bias current 2 by half and reduce power consumption by that amount.

Embodiment 6

Figure 6:
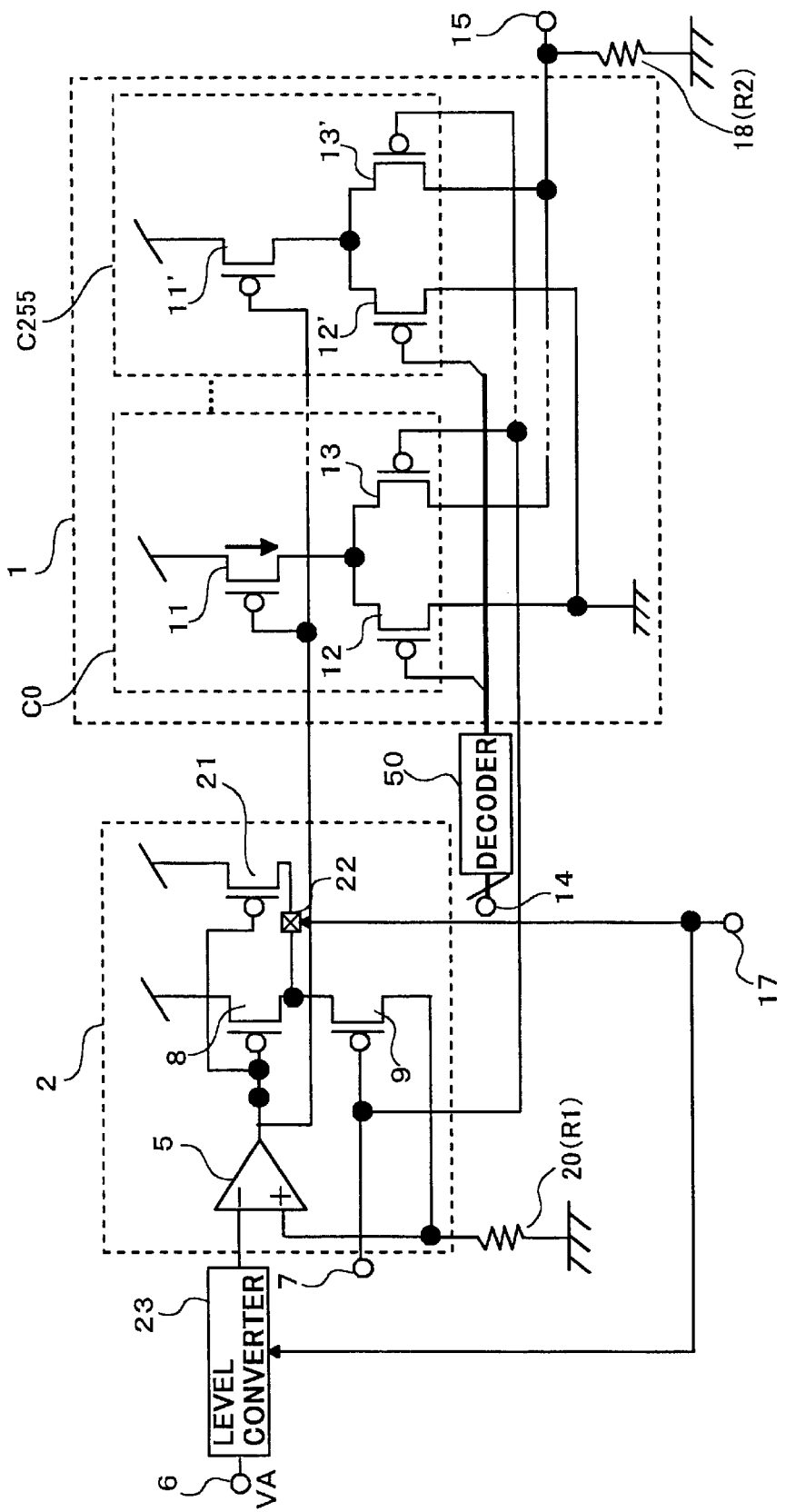
FIG. 6 is a circuit diagram showing a configuration of a current addition type D/A converter according to Embodiment 6 of the present invention.

FIG. 6 is a circuit diagram showing a configuration of a current addition type D/A converter according to Embodiment 6 of the present invention.

The basic configuration and operation are almost the same as those of the circuit (FIG. 5) of Embodiment 5. That is, this embodiment also seeks to reduce power consumption by reducing the operating current of bias circuit 2.

In Embodiment 5, the reference current is reduced to ½ by doubling the resistance value of the reference resistor. In this embodiment, however, level converter 23 reduces the level of reference voltage VA applied to reference voltage terminal 6 to ½ and reduces the reference current by half (I/2).

At the same time, switch 22 is turned OFF and the apparent size (W/L) of transistor 8 is reduced to ½. Reference current I/2 of the current mirror flows through transistor 8. Since the current mirror ratio is 1:2, the operating current of each current cell (C0 to C255) is I (=2·I/2).

Embodiment 7

Figure 7:
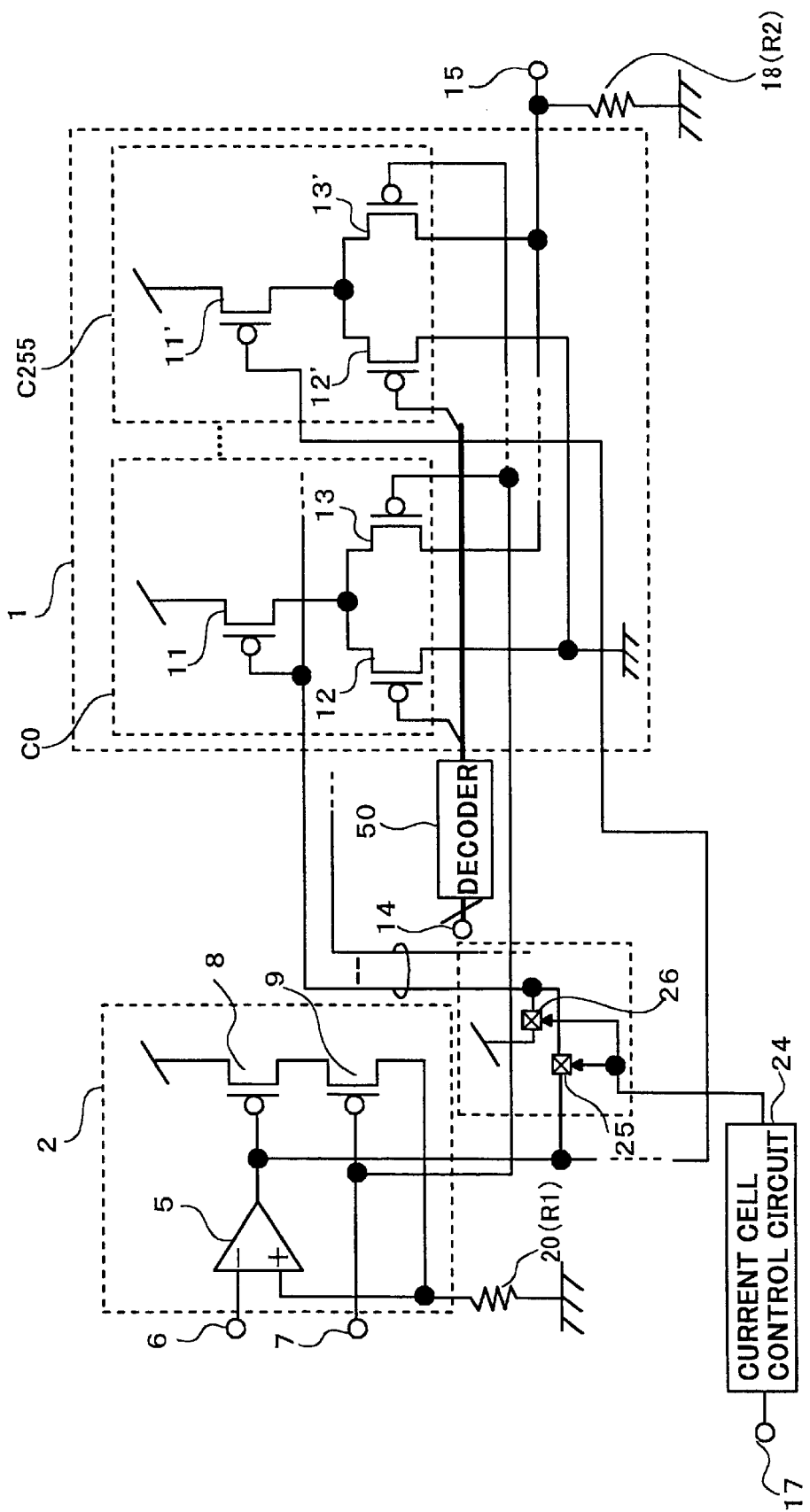
FIG. 7 is a circuit diagram showing a configuration of a current addition type D/A converter according to Embodiment 7 of the present invention.

FIG. 7 is a circuit diagram showing a configuration of a current addition type D/A converter according to Embodiment 7 of the present invention. The basic configuration is the same as that of the preceding embodiment.

However, the circuit of this embodiment adopts a configuration of turning OFF a current source transistor itself for some current cells in order to reduce power consumption. In this point, this embodiment is different from the preceding embodiment.

As shown in the figure, the D/A converter of this embodiment is provided with current cell restriction circuit 24.

Then, when a control signal is input to control terminal 17 and a low power consumption mode is entered, current cell control circuit 24 turns switch 25 OFF and turns switch 26 ON. Then, a power supply voltage (VDD) is applied to the gates of current source transistors (11 ... 11') in at least one predetermined current cell. As a result, the transistors (11 ... 11') turn OFF. That is, the current no longer flows through the current cells, and it is possible to reduce power consumption by that amount.

It is desirable to turn OFF the current of a current cell (a high-order current cell) corresponding to the higher bit of the input data in order to increase the effect in reducing power consumption.

Embodiment 8

Figure 8:
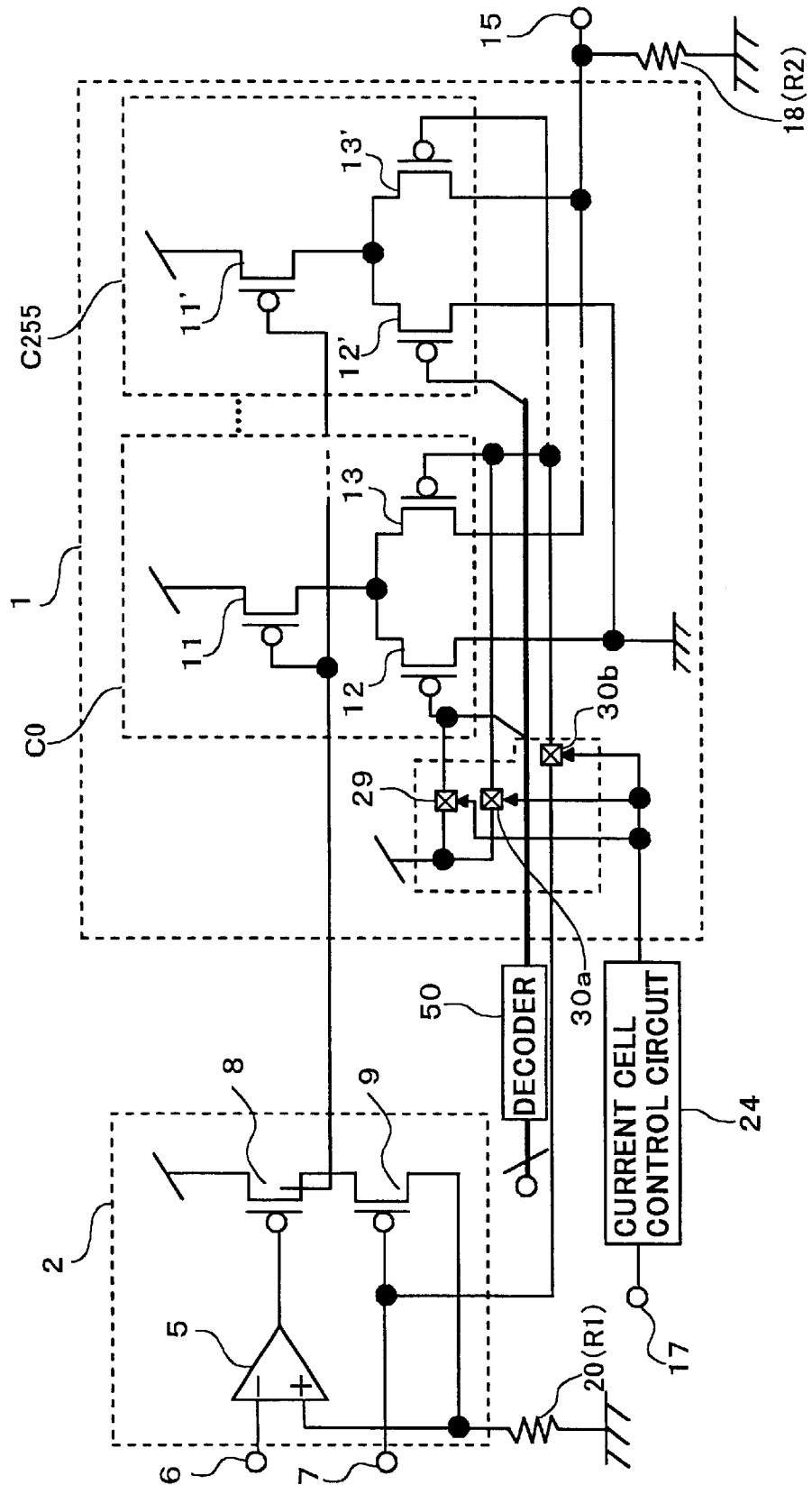
FIG. 8 is a circuit diagram showing a configuration of a current addition type D/A converter according to Embodiment 8 of the present invention.

FIG. 8 is a circuit diagram showing a configuration of a current addition type D/A converter according to Embodiment 8 of the present invention. The basic configuration and operation are almost the same as those of the circuit in Embodiment 7.

As in the case of the circuit in Embodiment 7, the circuit in this embodiment also seeks to reduce power consumption by turning OFF the current of some cells. However, this embodiment forcibly turns OFF switching transistors 12 and 13 that form a differential pair in a current cell. In this point, the circuit in this embodiment differs from the circuit in Embodiment 7.

As shown in FIG. 8, the D/A converter in this embodiment is provided with current cell restriction circuit 24.

Then, when a control signal is input to control terminal 17 and a low power consumption mode is selected, current cell control circuit 24 turns switch 30b OFF and turns switches 29 and 30a ON.

Then, a power supply voltage (VDD) is applied to the gates of both switching transistors 12 and 13 that form a differential pair in a predetermined current cell (for convenience of explanations, suppose current cell C0 here) and both transistors turn OFF. This reduces the operating current of current cell C0 to 0 and reduces power consumption by that amount.

In this embodiment, the current of current cell C0 is turned OFF for convenience of explanations, but it is actually desirable to turn OFF the current of a current cell corresponding to the higher bit of the input data.

Thus, bringing unused high-order current cells out of conduction allows the operating current in current cell matrix 1 to be reduced.

Embodiment 9

Figure 9:
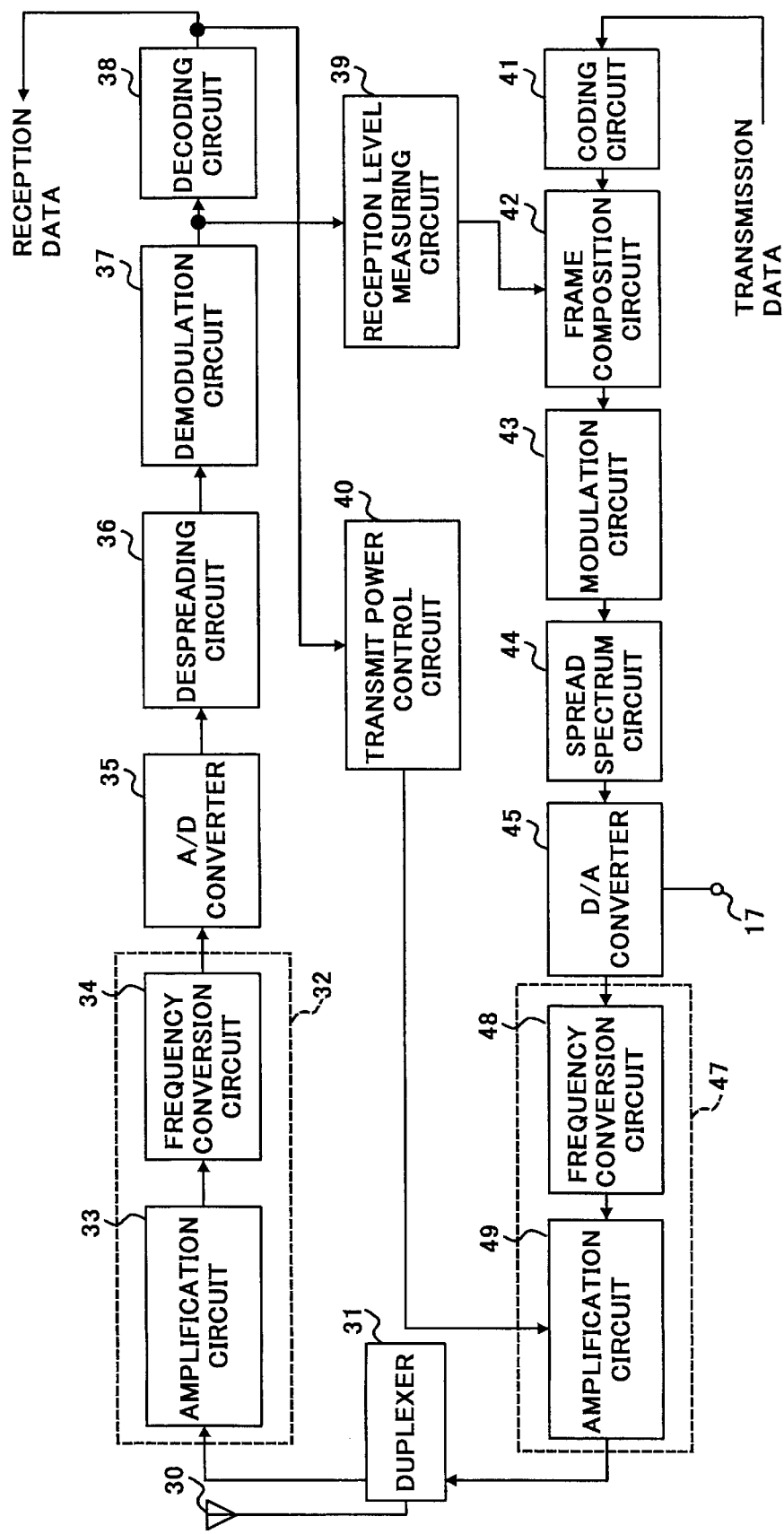
FIG. 9 is a block diagram showing an overall configuration of a cellular phone set equipped with a current addition type D/A converter of the present invention.

FIG. 9 is a block diagram showing a configuration of a cellular phone set equipped with a current addition type D/A converter with the configuration explained in the preceding embodiments.

What is shown in the upper half of FIG. 9 is a receiver and what is shown in the lower half is a transmitter.

Current addition type D/A converter 45 of the present invention is used for a transmitter. Reference numeral 17 denotes a terminal to input a control signal to select a low power consumption mode (control signal input terminal).

As shown in the figure, the transmitter comprises coding circuit 41, frame composition circuit 42, modulation circuit 43, spread spectrum circuit 44, D/A converter 45 of the present invention, transmission radio section 47 (including frequency conversion circuit 48 and amplification circuit 49).

On the other hand, the receiver comprises reception radio section 32 (including amplification circuit 33 and frequency conversion circuit 34), A/D converter 35, despreading circuit 36, demodulation circuit 37 and decoding circuit 38.

Reference numeral 30 denotes an antenna and reference numeral 31 denotes a duplexer. Reference numeral 39 denotes a reception level measuring circuit and reference numeral 40 denotes a transmit power control circuit.

The present invention reduces power consumption in D/A converter 45, and thus can extend the service life of a battery of a cellular phone set.

As explained above, the present invention exhaustively reduces needless operating currents by aiming at implementing a conversion rate specified by a standard only within the dynamic range of a D/A converter in actual use.

The conventional D/A converter makes a high current flow even for a maximum signal specified by a standard so as to enable the signal to be converted at a predetermined speed.

Thus, the present invention can drastically reduce power consumption of a current addition type D/A converter. With a mobile communication apparatus such as a cellular phone, signals with a maximum rating are rarely transmitted in normal voice transmission. Therefore, the present invention can be used for a transmission section of a mobile communication apparatus. The present invention can extend the service life of a battery in a cellular phone.

The present invention is not limited to the above described embodiments, and various variations and modifications may be possible without departing from the scope of the present invention.

This application is based on the Japanese Patent Application No.HEI11-316809 filed on Nov. 8, 1999, entire content of which is expressly incorporated by reference herein.

What is claimed is:

1. A current addition type D/A converter with a low power consumption mode that creates a reference current by applying a reference voltage to a resistor with a fixed resistance, creates a plurality of currents based on the reference current using a current mirror, controls whether or not each of the plurality of currents should be input to a current/voltage conversion resistor with a fixed resistor value according to input digital data, and generates a voltage corresponding to the input digital data at the current/voltage conversion resistor, comprising a control terminal that inputs a control signal to change the reference current by changing the reference voltage and changes said input data so as to compensate a variation of the reference current.

2. A communication apparatus provided with the D/A converter according to claim 1.

3. A current addition type D/A converter with a low power consumption mode that creates a reference current by applying a reference voltage to a resistor with a fixed resistance, creates a plurality of currents based on the reference current using a current mirror, controls whether or not each of the plurality of currents should be input to a current/voltage conversion resistor with a fixed resistor value according to input digital data, and generates a voltage corresponding to the input digital data at the current/voltage conversion resistor, comprising a control terminal that inputs a control signal to change said reference current by changing said reference voltage and executes bit shift processing on said input data so as to compensate a variation of the reference current.

4. A communication apparatus provided with the D/A converter according to claim 3.

5. A current addition type D/A converter with a low power consumption mode that creates a reference current by applying a reference voltage to a resistor with a fixed resistance, creates a plurality of currents based on the reference current using a current mirror, controls whether or not each of the plurality of currents should be input to a current/voltage conversion resistor with a fixed resistor value according to input digital data, and generates a voltage corresponding to the input digital data at the current/voltage conversion resistor, said converter comprising:

a control terminal that inputs a control signal to place said current addition type D/A converter in the low power consumption mode;

a reference voltage level adjusting circuit that adjusts a level of said reference voltage corresponding to said control signal provided to said control terminal; and a data processing circuit that executes processing, including a bit shift, on said input digital data, so as to compensate a variation of said reference current corresponding to the adjustment of the level of said reference voltage.

6. A current addition type D/A converter with a low power consumption mode comprising:

circuits that create a reference current by applying a reference voltage to a resistor with a fixed resistance value;

circuits that create a plurality of currents using a current mirror based on said reference current;

a current/voltage conversion resistor with a fixed resistance value;

a decoding circuit that decodes input data;

a bit shift circuit that applies bit shift processing on each bit of data output from said decoding circuit;

a plurality of switching circuits that switch whether or not each of said plurality of currents should be input to said current/voltage conversion resistor according to the output data of said bit shift circuit; and a control terminal that inputs a control signal to change said reference current by changing said reference voltage and makes said bit shift circuit perform bit shift processing so as to compensate a variation of said reference current.

7. A current addition type D/A converter with a low power consumption mode that creates a plurality of currents based on a reference current using a current mirror, controls whether or not each of said plurality of currents should be input to a current/voltage conversion resistor with a fixed resistor value according to input digital data, and generates a voltage corresponding to the input digital data at said current/voltage conversion resistor, comprising a control terminal that inputs a control signal to change said reference current and to change, said input data so as to compensate a variation of the reference current.

8. The current addition type D/A converter according to claim 7, further comprising a bit shift circuit, said control signal being input to said bit shift circuit.

* * * * *

UNITED STATES PATENT AND TRADEMARK OFFICE
CERTIFICATE OF CORRECTION

PATENT NO.    : 6,353,402 B1
DATED         : March 5, 2002
INVENTOR(S)   : K. Kanamori It is certified that error appears in the above-identified patent and that said Letters Patent is hereby corrected as shown below:

Column 12,
Line 42, after "change", delete ",".

Signed and Sealed this

Thirty-first Day of December, 2002

JAMES E. ROGAN
*Director of the United States Patent and Trademark Office*